United States Patent [19]
Yamamoto

[11] Patent Number: 5,125,508
[45] Date of Patent: Jun. 30, 1992

[54] TAPE-FORM ELECTRONIC COMPONENT PACKAGE

[75] Inventor: Takashi Yamamoto, Kyoto, Japan

[73] Assignee: Murata Manufacturing Co., Ltd., Kyoto, Japan

[21] Appl. No.: 794,366

[22] Filed: Nov. 13, 1991

Related U.S. Application Data

[63] Continuation of Ser. No. 548,477, Jul. 5, 1990, abandoned.

[30] Foreign Application Priority Data

Jul. 6, 1989 [JP] Japan ................ 1-80000[U]

[51] Int. Cl.⁵ .................. B65D 73/02; B65D 85/42
[52] U.S. Cl. ..................... 206/330; 206/332; 206/820
[58] Field of Search ................. 206/328–330, 206/332, 486, 820

[56] References Cited

U.S. PATENT DOCUMENTS

| 4,298,120 | 11/1981 | Kaneko et al. | 206/329 |
| 4,633,370 | 12/1986 | Hamuro et al. | 206/330 X |
| 4,724,958 | 2/1988 | Kaneko et al. | |
| 4,852,737 | 8/1989 | Noll | 206/330 |
| 4,867,308 | 9/1989 | Crawford et al. | 206/330 |
| 4,898,275 | 2/1990 | Skrtic et al. | 206/330 |

FOREIGN PATENT DOCUMENTS

| 59-03194 | 8/1984 | Japan | 206/328 |
| 60-79797 | 6/1985 | Japan . | |
| 63-232168 | 9/1988 | Japan . | |
| 1-264204 | 10/1989 | Japan . | |

Primary Examiner—Bryon P. Gehman
Attorney, Agent, or Firm—Armstrong & Kubovcik

[57] ABSTRACT

A tape-form electronic component package accommodates a plurality of electronic components in a carrier tape. A tape main body has a plurality of cavities, each having a shape indicating a direction, for accommodating electronic components respectively. The cavities are arranged obliquely against a longer side of the tape main body.

12 Claims, 3 Drawing Sheets

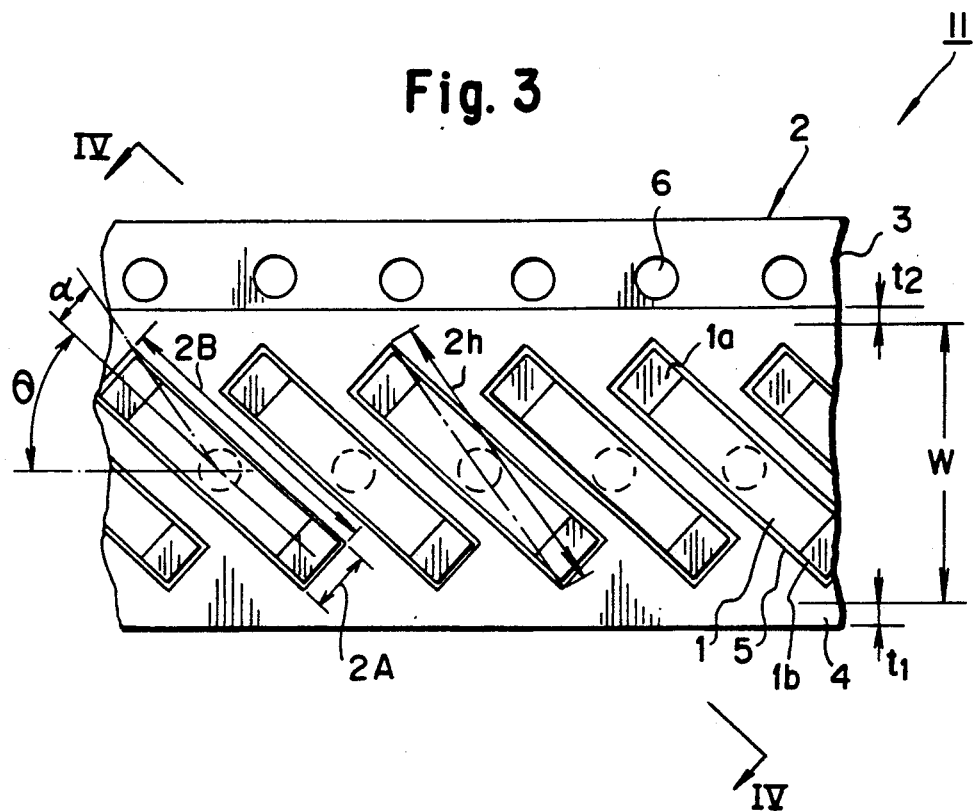
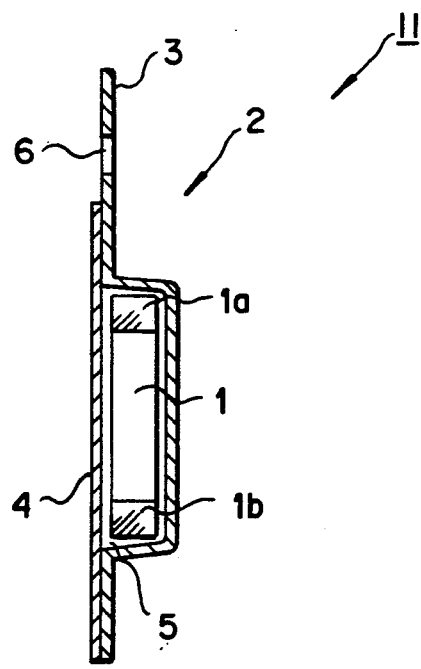

TAPE-FORM ELECTRONIC COMPONENT PACKAGE

This application is a continuation of application Ser. No. 548,477 filed July 5, 1990, now abandoned.

BACKGROUND OF THE INVENTION (1) Field of the Invention

This invention relates to a tape-like electronic component package comprising a plurality of electronic components accommodated in a tape.

(2) Description of the Prior Art

A tape-like electronic component package is generally used in a tape carrier system, which is a method of supplying components to an automatic assembly machine. The tape-like electronic component package is usually rolled around a reel. While it is taken out by the automatic assembly machine, electronic components accommodated therein are taken out one by one and mounted on a printed circuit board.

The electronic components are accommodated in a carrier tape, a conventional construction of which is shown in FIGS. 1 and 2.

The carrier tape comprises a main body 21 and a cover tape 23 covering the main body 21. The main body 21 has a plurality of cavities 22, each of which accommodates a chip component 20 such as a capacitor equipped with electrodes 20a and 20b at both ends thereof. The cavities 22, which are usually rectangular, are arranged with longer sides thereof being perpendicular to a longer side of the main body 21. 24 refers to feeding perforations.

In such a conventional tape-like electronic component package, carrier tapes of a single width are not always appropriate for electronic components of different lengths. For example, a 12 mm-wide carrier tape has 7.3 mm-long cavities 22 at the maximum since an area for the feeding perforations 24 and adhering areas for the cover tape 23 are required. For a bigger component, a 16 mm-wide carrier tape is necessary.

This results in that carrier tapes should be replaced frequently from one width to another in accordance with the length of the electronic components. This lowers operating efficiency in accommodating the electronic components in the cavities and in taking them out from the cavities for mounting.

SUMMARY OF THE INVENTION

Accordingly, it is an object of this invention to offer a tape-like electronic component package which improves operating efficiency in accommodating electronic components and in taking them out for mounting.

It is another object of this invention to offer a tape-like electronic component package wherein a carrier tape of the same width can be used for accommodating electronic components of a different length.

The above objects are fulfilled by a tape-like electronic component package wherein a plurality of electronic components are retained along a longer side thereof, the package comprising a lengthy main body having a plurality of cavities, each having a big enough a volume to accommodate an electronic component, having a shape indicating a direction and being arranged obliquely against a longer side of the main body; electronic components accommodated in the cavities, respectively; and a cover tape adhered on an upper surface of the main body to cover the cavities accommodating the electronic components.

The above objects are also fulfilled by a tape-like electronic component package wherein a plurality of electronic components are retained, the package comprising a lengthy base body having a thickness at least the same as that of electronic components to be accommodated therein and also having a plurality of through holes, the holes having a shape indicating a direction and being arranged obliquely against a longer side of the base body; a first cover tape adhered on a bottom surface of the base body to cover bottom openings of the through holes, thereby forming cavities for accommodating the electronic components; electronic components accommodated in the cavities, respectively; and a second cover tape adhered on an upper surface of the base body to cover upper openings of the cavities.

The electronic components may be chips without leads and are rectangular when seen from the top, and the cavities may be rectangular accordingly.

All the cavities may be arranged obliquely with a same angle against the longer side of the main body.

The angle may be determined so that it satisfy $2(A^2+B^2)^{\frac{1}{2}}\cdot\sin(\theta+\alpha)\leq W$ where 2A is a length of a shorter side of the cavity, 2B is a length of a longer side of the cavity, W is a width of a portion of the main body, the portion being where the cavities can be formed and $\alpha$ is an angle made by the longer side of the cavity and a diagonal line of the cavity.

The main body may have feeding perforations at such positions that the main body be fed without being disturbed by the cavities.

The tape-like electronic component package may further comprise a reel for rolling the main body which has the electronic components in the cavities thereof and the cover tape adhered thereon.

According to the above construction, the cavities are arranged obliquely against the longer side of the carrier tape. Therefore, carrier tapes of a single width can accommodate the electronic components which would require a wider carrier tape in a conventional package. In other words, electronic components of diverse length variations can be handled by single-width carrier tapes. As a result, operating efficiency in accommodating the electronic components and taking them out for mounting is enhanced.

BRIEF DESCRIPTION OF THE DRAWINGS

These and other objects, advantages and features of the invention will become apparent form the following description thereof taken in conjunction with the accompanying drawings which illustrate specific embodiments of the invention. In the drawings:

FIG. 3 is a top view of a first embodiment of the present invention;

FIG. 4 is a cross sectional view of the same taken along the IV—IV line of FIG. 3 (Concerning the electronic component inside the cavity, its outer surface is shown);

DETAILED DESCRIPTION OF THE PREFERRED EMBODIMENTS

Figure 1:
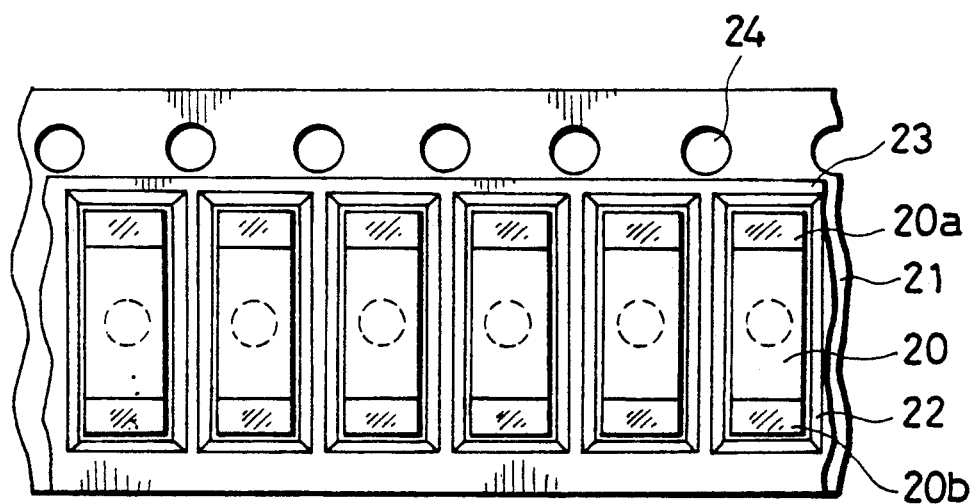
FIG. 1 is a top view of a conventional tape-like electronic component package.
Figure 2:
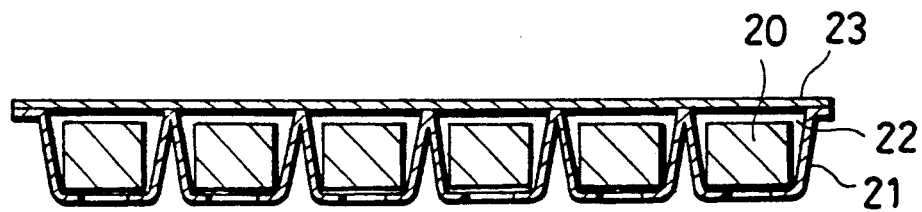
FIG. 2 is a cross sectional view of the same.

A first embodiment of this invention will be described referring to FIGS. 3 through 5. FIG. 3 is a top view and FIG. 4 is a cross sectional view of a tape-like electronic component package as the first embodiment.

The tape-like electronic component package 11 comprises a carrier tape 2 and electronic components 1 accommodated therein. The carrier tape 2 comprises a lengthy main body 3 and a cover tape 4 adhered thereon to cover the main body 3 except a marginal area for a plurality of feeding perforations 6. The main body 3 has the feeding perforations 6 arranged in the marginal area along a longer side thereof and also has a plurality of cavities 5, for accommodating the electronic components 1 respectively, in the remaining area. The cavities 5 are formed by partially depressing the main body 3. Each cavity 5 has a large enough volume for the electronic component 1 which is to be accommodated therein and has a shape indicating a direction. Since the electronic components 1 used in this embodiment are chip components, such as two-port resonators or capacitors equipped with electrodes $1a$ and $1b$ at both ends thereof and are rectangular when seen from the top, the cavities 5 are also rectangular when seen from the top. The cavities 5 are arranged at a constant pitch and obliquely with a specified angle ($\theta$ degrees) against the longer side of the main body 3. The above angle is determined based on the relationship between a practical width W of the main body 3 and a length of the cavity 5. The practical width W, namely the width of a portion of the main body, the portion being where the cavities 5 can be formed, is obtained by subtracting widths $t_1$ and $t_2$ of tape adhering areas from a width of the cover tape 4.

Provided the length of the diagonal line of the cavity 5 is $2h$, the angle made by a longer side of the cavity 5 and the diagonal line is $\alpha$, $\theta$ is obtained by the formula (1).

$$2h\sin(\theta+\alpha) \leq W \ldots \quad (1)$$

Provided the length of the shorter side of the cavity 5 is 2A and that of the longer side is 2B, $2h$ is obtained by the formula (2).

$$2h = 2(A^2+B^2)^{\frac{1}{2}} \ldots \quad (2)$$

Obtained from the above two formulas is the formula (3).

$$2(A^2+B^2)^{\frac{1}{2}} \cdot \sin(\theta+\alpha) \leq W$$

$$\text{where } 2B < W \ldots \quad (3)$$

If the cavities 5 are formed obliquely with $\theta$ satisfying the formula (3), electronic components of a different length can be accommodated in a main body of the same width.

Figure 5:
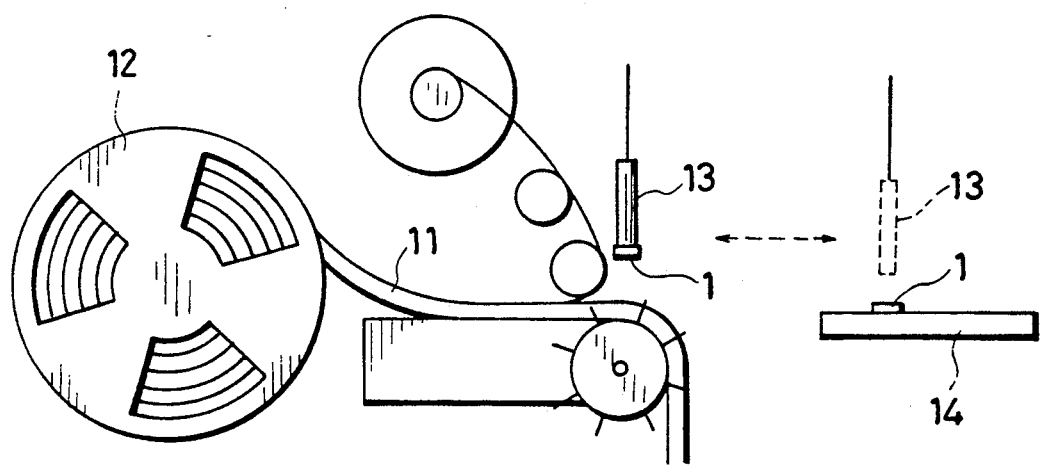
FIG. 5 is a view explaining a usage of the first embodiment.

FIG. 5 illustrates a usage of the tape-like electronic component package 11. The carrier tape 2 is usually rolled around a reel 12. While the carrier tape 2 is taken out from the reel 12, the electronic components 1 accommodated therein are taken out one by one by a suction nozzle 13 provided in an automatic assembling machine and are mounted on a printed circuit board 14.

Figure 6:
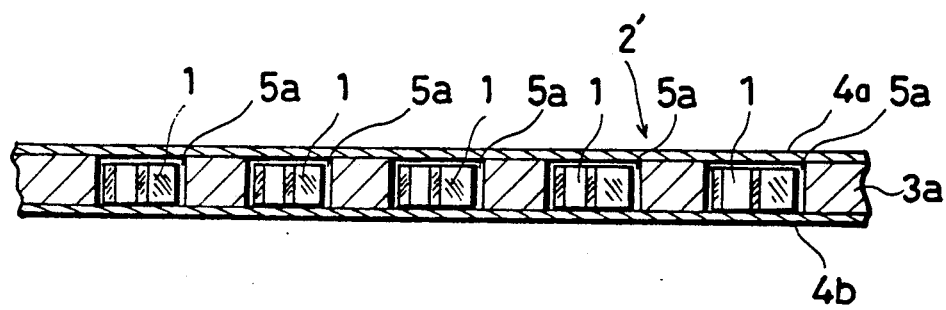
FIG. 6 is a cross sectional view of a second embodiment of the present invention.

FIG. 6 shows a second embodiment of this invention. A carrier tape 2' comprises a base body $3a$, a first cover tape $4a$ and a second cover tape $4b$. The base body $3a$ is at least as thick as the electronic components 1 to be accommodated therein and has a plurality of through holes $5a$ at positions where the electronic components 1 are to be accommodated. Although not shown here, the through holes $5a$ are rectangular when seen from the top and are arranged obliquely against a longer side of the base body $3a$. The first cover tape $4a$ is adhered on a bottom surface of the base body $3a$ to cover bottom openings of the through holes $5a$, whereby forming cavities 5. The second cover tape $4b$ is adhered on an upper surface of the base body $3a$ to cover upper openings of the cavities 5. The angle made by a longer side of each through hole $5a$ and the longer side of the base body $3a$ is obtained from the formula (3).

The package 11 according to the second embodiment is also used as shown in FIG. 5.

Although the present invention has been fully described by way of embodiments with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An electronic component package in a form of a tape wherein a plurality of electronic components are retained along a longer side thereof, said electronic component package comprising:
   an elongated main body having a plurality of rectangular cavities extending perpendicularly from a surface of the main body, each cavity having a volume large enough to accommodate an electronic component, each cavity having a uniform depth throughout an interior of the cavity and sides of said cavity arranged obliquely with respect to a longer side of said main body wherein the length of the cavity is greater than the width of the main body;
   electronic components accommodated in the cavities respectively; and
   a cover tape adhered on an upper surface of said main body to cover the cavities accommodating the electronic components.

2. An electronic component package according to claim 1, wherein said electronic components are chips without leads and are rectangular when seen from a top view.

3. An electronic component package according to claim 2, wherein all the obliquely arranged cavities are arranged having a same oblique angle with respect to the longer side of said main body.

4. An electronic component package according to claim 3, wherein the oblique angle $\theta$ is determined to satisfy an equation $2(A^2+B^2)^{\frac{1}{2}} \cdot \sin(\theta+\alpha) \leq W$ where A is half of a length of a shorter side of one of said cavities, B is half of a length of a longer side of one of said cavities, W is a width of a portion of said main body, the portion being where the cavities can be formed and $\alpha$ is an angle made between the longer side of the cavity and a diagonal line of the cavity.

5. An electronic component package according to claim 1, wherein said main body has feeding perforations at positions thereof that said main body can be transported without disturbing the cavities.

6. An electronic component package according to claim 1, further comprising:
   a reel for rolling said main body which has said electronic components in the cavities thereof and said cover tape adhered thereon.

7. An electronic component package in a form of a tape wherein a plurality of electronic components are retained, said electronic component package comprising:
   an elongated base body having a thickness at least equal to that of electronic components to be accommodated therein and also having a plurality of rectangular through holes extending perpendicularly from a surface of the base body, each hole having a uniform depth through an interior of the hole and sides of said holes arranged obliquely with respect to a longer side of said base body wherein the length of the holes is greater than the width of the base body;
   a first cover tape adhered on a bottom surface of said base body to cover bottom openings of the through holes, therein forming cavities of uniform depth for accommodating the electronic components;
   electronic components accommodated in the cavities respectively; and
   a second cover tape adhered on an upper surface of said base body to cover upper openings of the cavities.

8. An electronic component package according to claim 7, wherein said electronic components are chips without leads and are rectangular when seen from a top view.

9. An electronic component package according to claim 8, wherein all the obliquely arranged cavities are arranged having a same oblique angle O with respect to the longer side of said main body.

10. An electronic component package according to claim 9, wherein the oblique angle $\theta$ is determined to satisfy an equation $2(A^2+B^2)^{\frac{1}{2}}\cdot\sin(\theta+\alpha)\leq W$ wherein A is half of a length of a shorter side of one of said cavities, B is half of a length of a longer side of one of said cavities, W is a width of a portion of said main body, the portion being where the cavities can be formed and $\alpha$ is an angle made between the longer side of the cavity and a diagonal line of the cavity.

11. An electronic component package according to claim 7, wherein said main body has feeding perforations at positions thereof that said main body can be transported without disturbing the cavities.

12. An electronic component package according to claim 7, further comprising:
   a reel for rolling said main body which has said electronic components in the cavities thereof and said cover tape adhered thereon.

* * * * *